United States Patent
Okamura (10) Patent No.: US 7,499,511 B2
(45) Date of Patent: Mar. 3, 2009

(54) CLOCK RECOVERY SYSTEMS AND METHODS FOR ADJUSTING PHASE OFFSET ACCORDING TO DATA FREQUENCY

(75) Inventor: Hitoshi Okamura, Gyeonggi-do (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 577 days.

(21) Appl. No.: 11/346,530

(22) Filed: Feb. 2, 2006

(65) Prior Publication Data

US 2006/0190756 A1 Aug. 24, 2006

(30) Foreign Application Priority Data

Feb. 7, 2005 (KR) .................. 10-2005-0011440

(51) Int. Cl.
*H04L 7/00* (2006.01)
(52) U.S. Cl. .................. 375/355; 375/371; 375/375; 375/376; 327/141; 327/155; 327/160
(58) Field of Classification Search ............... 375/354, 375/355, 371, 374–376; 327/141, 146, 151, 327/155, 148, 150, 157, 160
See application file for complete search history.

(56) References Cited

U.S. PATENT DOCUMENTS

| | | |
|---|---|---|
| 5,761,255 A | 6/1998 | Shi |
| 5,812,619 A | 9/1998 | Runaldue |
| 6,392,457 B1 * | 5/2002 | Ransijn .................. 327/156 |
| 7,197,098 B2 * | 3/2007 | Johnson .................. 375/371 |
| 2005/0084048 A1 * | 4/2005 | Wu |

FOREIGN PATENT DOCUMENTS

| | | |
|---|---|---|
| JP | 06-296184 | 10/1994 |
| JP | 2003-318705 | 11/2003 |
| KR | 1020040034920 A | 4/2004 |
| TW | 444482 | 7/2001 |

OTHER PUBLICATIONS

Notice of First Office Action in corresponding Taiwanese Application No. 095104009, mailed Jul. 21, 2008, pp. 1-3.

* cited by examiner

*Primary Examiner*—Dac V Ha
(74) *Attorney, Agent, or Firm*—Myers Bigel Sibley & Sajovec, P.A.

(57) ABSTRACT

A clock recovery system includes a sampler that is configured to sample an input data signal in synchronization with a modulated clock signal to generate a sample of the input data signal. A phase comparator is configured to compute a position of a transition edge of the input data signal using the sample data signal, and to compare the computed position with a position of an edge of the modulated clock signal to generate a comparison result. An edge counter is configured to count transition edges of the sample data signal. A controller is configured to generate first and second control signals based on the comparison result and the count of the transition edges. A clock phase modulator is configured to generate the modulated clock signal by adjusting a phase of an input clock signal responsive to the first and second control signals, such that the phase is increased in response to the first control signal and reduced in response to the second control signal.

16 Claims, 5 Drawing Sheets

FIG. 7

CLOCK RECOVERY SYSTEMS AND METHODS FOR ADJUSTING PHASE OFFSET ACCORDING TO DATA FREQUENCY

CROSS-REFERENCE TO RELATED PATENT APPLICATION

This application claims the priority of Korean Patent Application No. 10-2005-0011440, filed on Feb. 7, 2005, in the Korean Intellectual Property Office, the disclosure of which is hereby incorporated herein by reference in its entirety.

BACKGROUND OF THE INVENTION

1. Field of the Invention

The present invention relates to clock recovery systems and methods, and, more particularly, to clock recovery systems and methods for improving jitter tolerance.

2. Description of the Related Art

Figure 1:
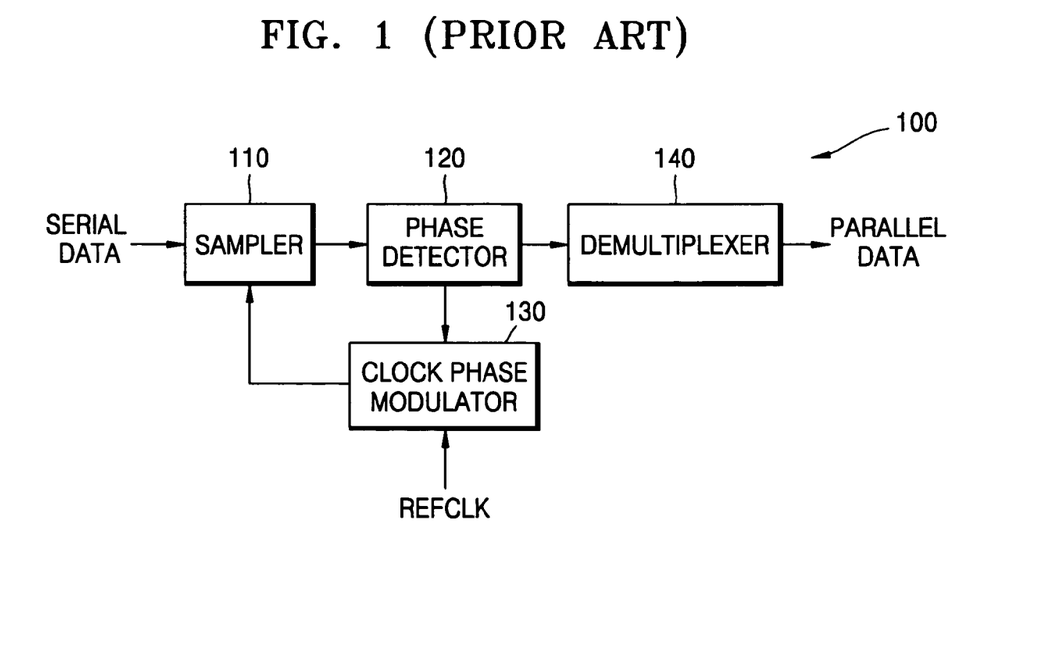
FIG. 1 is a block diagram of a conventional clock recovery system.

FIG. 1 is a block diagram of a conventional clock recovery system 100. The conventional clock recovery system 100 includes a sampler 110, a phase detector 120, a clock phase modulator 130, and a demultiplexer 140.

The sampler 110 obtains a sample data signal of a serial data input signal. The phase detector 120 detects the phase of the serial data input signal from the sample data signal. The clock phase modulator 130 generates a modulated clock signal by modulating the phase of a reference clock signal REF-CLK according to the detected phase. The sampler 110 obtains the sample data signal of the serial data input signal in synchronization with the modulated clock signal. The demultiplexer 140 transforms the sample data signal into a parallel data signal in synchronization with the modulated clock signal.

When applying the conventional clock recovery system 100 to a high-speed data receiving system, phase information regarding the serial data input signal, i.e., transition edge information, is used as a factor in generating a clock signal that helps in receiving the serial data input signal. However, the conventional clock recovery system 100 regards the phase of the serial data input signal detected by the phase detector 120 as an average phase, adjusts an edge of the modulated clock signal to be positioned in the middle of a rising edge and a falling edge of the serial data input signal (the center of the input serial data signal eye), and obtains a sample of the serial data input signal.

However, if a received data signal contains an Inter Symbol Interference (ISI) jitter due to transmission loss characteristics of a transmission line, amplitudes of a high-frequency data signal and a low-frequency data signal are different from each other and, thus, the centers of the transitions are not the same even when transitions in the high-frequency and low-frequency data signals begin at the same position.

Figure 2:
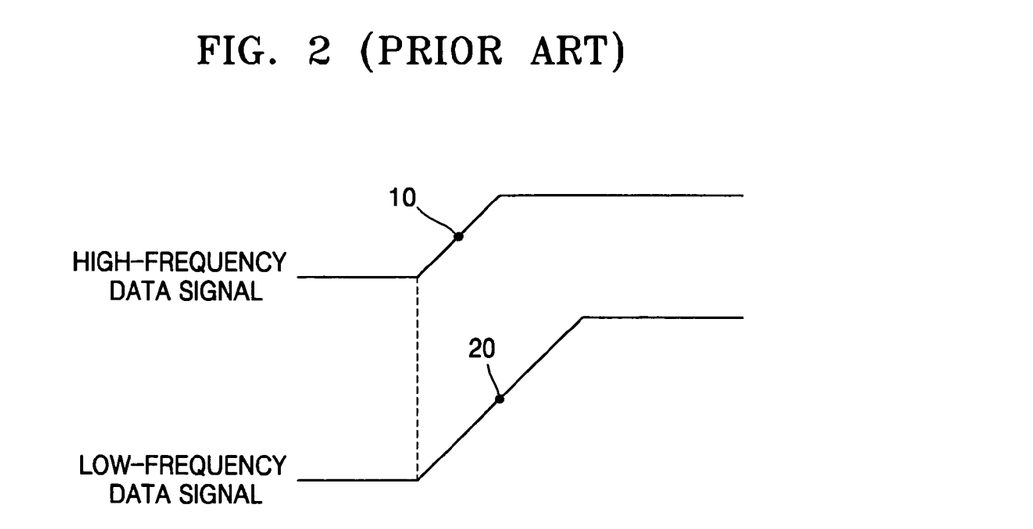
FIG. 2 illustrates the positions of edges of a conventional low-frequency data signal and a conventional high-frequency data signal.

FIG. 2 illustrates the positions of edges of a conventional low-frequency data signal and a conventional high-frequency data signal. Referring to FIG. 2, a center 10 of a rising edge of the high-frequency data signal, whose amplitude is less than that of the low-frequency data signal, is positioned to the left of a center 20 of an edge of the low-frequency data signal.

Thus, in the conventional clock recovery system 100 of FIG. 1, when the low-frequency data signal is received after the high-frequency data signal has been continuously received or vice versa, an edge of the clock signal modulated by the clock phase modulator 130 for sampling is positioned at a position corresponding to an edge of the high-frequency data signal or the low-frequency data signal. In this case, because a timing margin of a data signal whose frequency is changed may be insufficient, an error may occur during the receipt of a data signal.

SUMMARY

According to some embodiments of the present invention, a clock recovery system includes a sampler that is configured to sample an input data signal in synchronization with a modulated clock signal to generate a sample of the input data signal. A phase comparator is configured to compute a position of a transition edge of the input data signal using the sample data signal, and to compare the computed position with a position of an edge of the modulated clock signal to generate a comparison result. An edge counter is configured to count transition edges of the sample data signal. A controller is configured to generate first and second control signals based on the comparison result and the count of the transition edges. A clock phase modulator is configured to generate the modulated clock signal by adjusting a phase of an input clock signal responsive to the first and second control signals, such that the phase is increased in response to the first control signal and reduced in response to the second control signal.

In other embodiments of the present invention, the input data signal is a serial data signal. The clock recovery system further includes a de-serializer that is configured to transform the sample data signal into a parallel data signal responsive to the modulated clock signal.

In still other embodiments of the present invention, a phase-locked loop is configured to multiply a frequency of a reference clock signal to generate the input clock signal.

In still other embodiments of the present invention, the controller is further configured to generate the first and second control signals such that an amplitude of the first control signal is greater than an amplitude of the second control signal so as to move the phase of the modulated clock signal to the right of a center of an input data signal eye if the transition edge count indicates that the input data signal has a high frequency, and to generate the first and second control signals such that the amplitude of the second control signal is greater than the amplitude of the first control signal so as to move the phase of the modulated clock signal to the left of the center of the input data signal eye if the transition edge count indicates that the input data signal has a low frequency.

In still other embodiments of the present invention, the controller comprises a mixer that is configured to generate an output responsive to the comparison result and the transition edge count, a loop filter that is configured to generate an average of the mixer output, and a control signal generator that is configured to compare the average with a threshold to generate the first and second control signals.

In still other embodiments, the control signal generator is further configured to generate the first and second control signals, such that the amplitude of the first control signal is greater than the amplitude of the second control signal when the average is greater than the threshold and the amplitude of the first control signal is less than the amplitude of the second control signal when the average is less than the threshold.

In still other embodiments, the controller comprises a loop filter that is configured to generate an average of the comparison result, a mixer that is configured to generate an output responsive to the average and the transition edge count, and a control signal generator that is configured to compare the mixer output with a threshold to generate the first and second control signals.

In still other embodiments, the control signal generator is further configured to generate the first and second control signals, such that the amplitude of the first control signal is greater than the amplitude of the second control signal when the mixer output is greater than the threshold and the amplitude of the first control signal is less than the amplitude of the second control signal when the mixer output is less than the threshold.

In further embodiments of the present invention, a clock recovery method includes sampling an input data signal in synchronization with a modulated clock signal to generate a sample of the input data signal, computing a position of a transition edge of the input data signal using the sample data signal, comparing the computed position with a position of an edge of the modulated clock signal to generate a comparison result, counting transition edges of the sample data signal, generating first and second control signals based on the comparison result and the count of the transition edges, and generating the modulated clock signal by adjusting a phase of an input clock signal responsive to the first and second control signals, such that the phase is increased in response to the first control signal and reduced in response to the second control signal.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF EMBODIMENTS

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
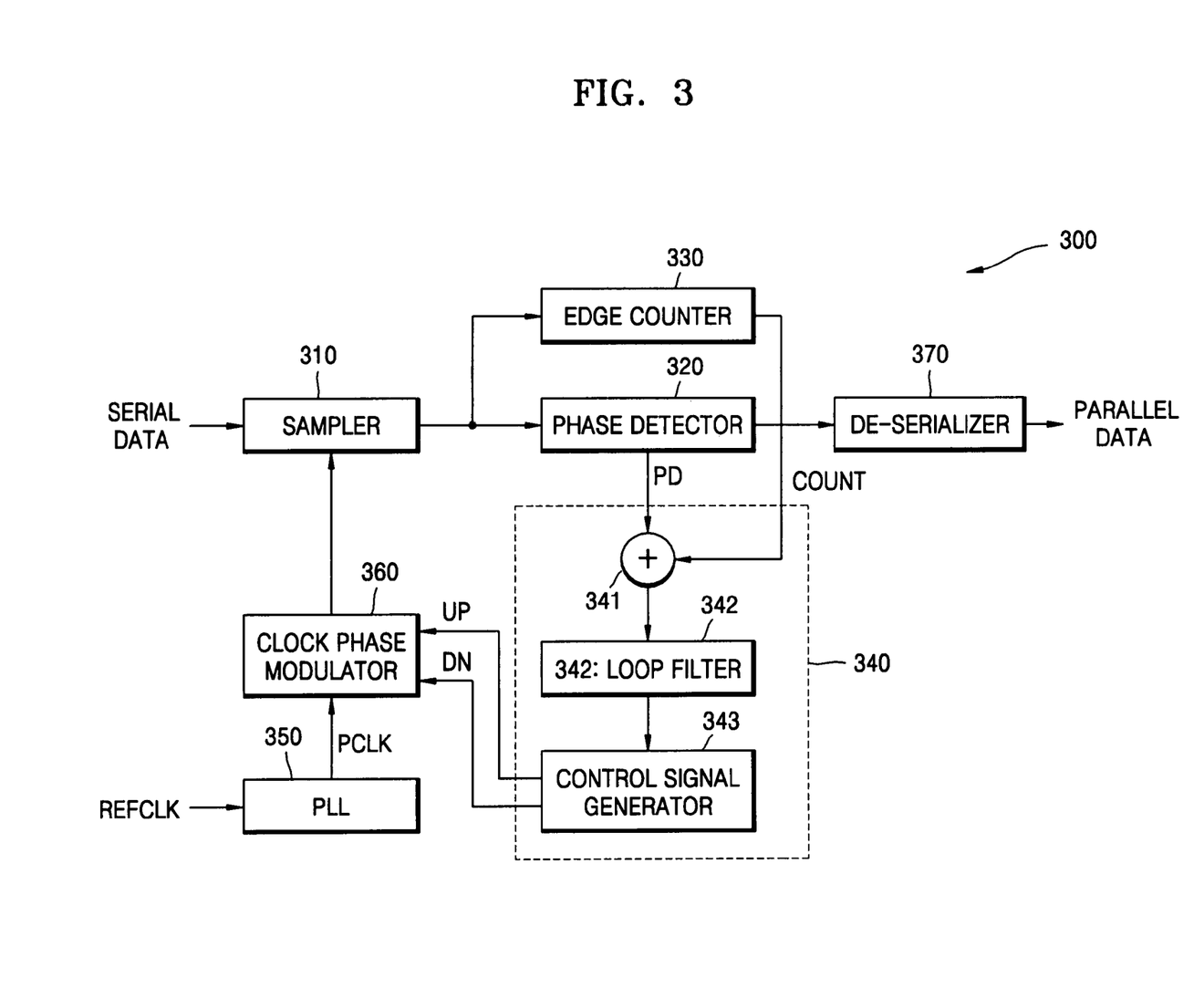
FIG. 3 is a block diagram of a clock recovery system according to some embodiments of the present invention.

FIG. 3 is a block diagram of a clock recovery system 300 according to some embodiments of the present invention. The clock recovery system 300 includes a sampler 310, a phase comparator 320, an edge counter 330, a controller 340, a phase-locked loop (PLL) 350, a clock phase modulator 360, and a de-serializer 370.

The clock recovery system 300 is designed to adjust the position of an edge of a sample clock signal according to the frequency of transitions of a serial data input signal. When a high-frequency serial data signal is received after a low-frequency serial data signal or vice versa, the edge of the sample clock signal is adjusted according to a change of signal frequency between the high-frequency serial data signal and the low-frequency serial data signal.

Figure 4:
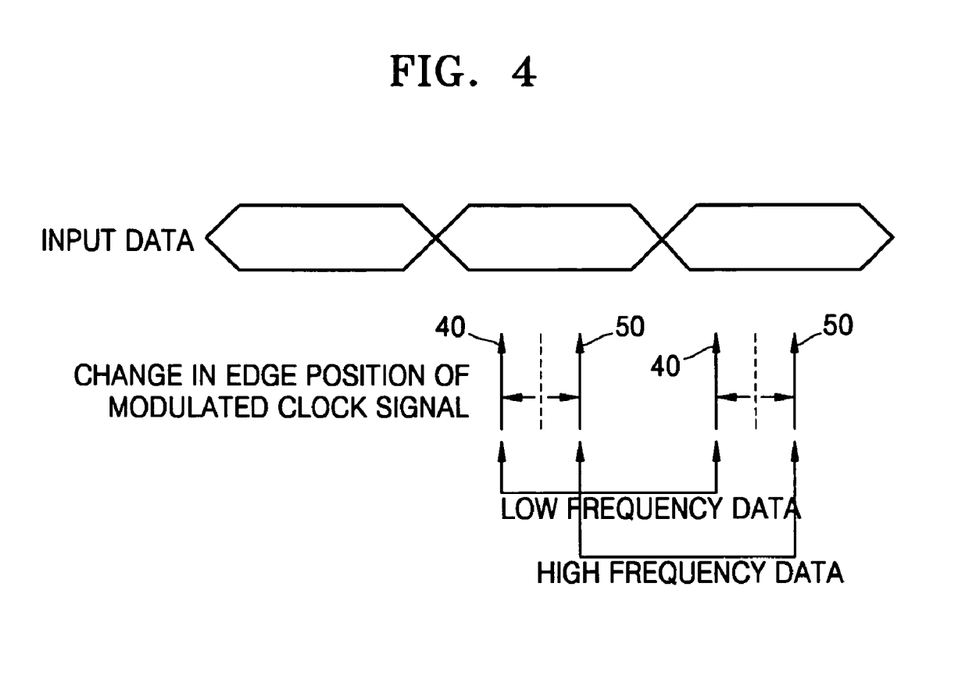
FIG. 4 illustrates edge positions of a low-frequency data signal and a high-frequency data signal according to some embodiments of the present invention.

In general, the edge of the sample clock signal is positioned about in the middle of a rising edge and a falling edge of an input data signal. As illustrated in FIG. 4, according to some embodiments of the present invention, when the input data signal has a high frequency, the edge of the sample clock signal is moved to the right 50 of the center of a data signal eye, thereby increasing a jitter tolerance level. When the input data signal has a low frequency, the edge of the sample clock signal is moved to the left 40 of the center of the data signal eye, thereby increasing the jitter tolerance level.

In response to a clock signal modulated according to the frequency of the input data signal, the sampler 310 obtains a sample data signal by sampling the input serial data in synchronization with the modulated clock signal.

The modulated clock signal is generated by the clock phase modulator 360 that modulates the phase of an input clock signal. The clock phase modulator 360 generates the modulated clock signal by adjusting the input clock signal according to a first control signal UP and a second control signal DN that are changed according to the frequency of the input data signal. The input clock signal may be a predetermined reference clock signal REFCLK, or a clock signal PCLK generated by the PLL 350. The PLL 350 generates the clock signal PCLK, which is synchronized with the predetermined reference clock signal REFCLK, by multiplying the frequency of the predetermined reference clock signal REFCLK.

To generate the first and second control signals UP and DN, the phase comparator 320 computes the position of a transition of the input data signal using the sample data signal output from the sampler 310. The position of the transition of the input data signal may be computed by determining the length of time required for the sample data signal greater than (or less than) a predetermined threshold to become less than (or greater than) the predetermined threshold. The phase comparator 320 also compares the computed position of the transition of the input data signal with the position of an edge of the clock signal modulated by the clock phase modulator 360. The computed position may be compared with the position of the modulated clock signal by applying the modulated clock signal to the phase comparator 320. Alternatively, the phase comparator 320 computes an average of positions of edges of input data signals computed for a predetermined time and compares the average with the position of the edge of the input data signal to generate a comparison result PD.

Figure 5:
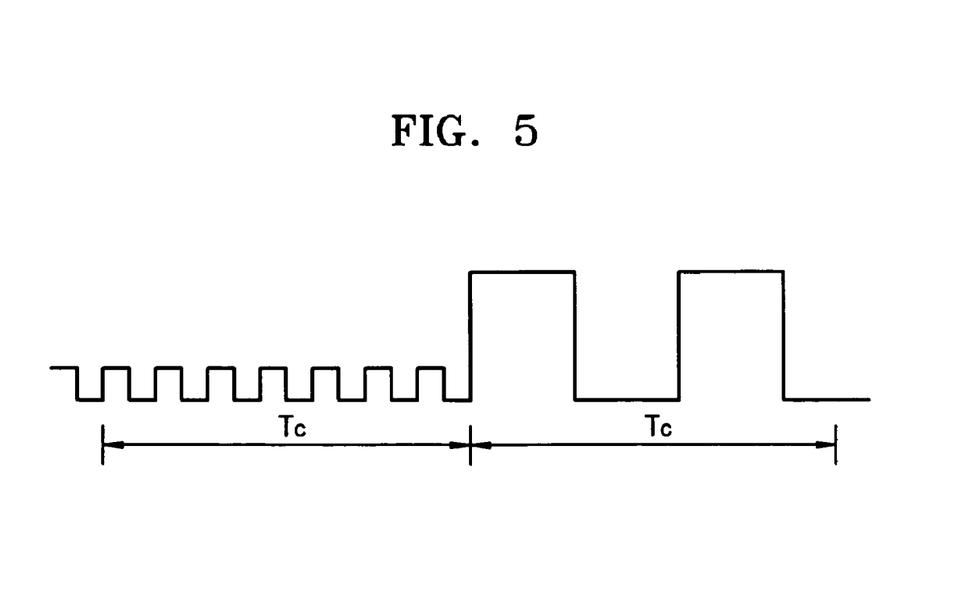
FIG. 5 is a waveform diagram illustrating transitions in an input data signal according to some embodiments of the present invention.

The edge counter 330 counts a number of transitions of the input data signal in the sample of the input data signal output from the sampler 310. FIG. 5 is a waveform diagram illustrating transitions in an input data signal according to some embodiments of the present invention. Referring to FIG. 5, the edge counter 330 counts rising edges or falling edges of the input data signal for a predetermined time Tc. For example, when the sample of the input data signal output from the sampler 310 has a high frequency, the COUNT result has a large value (seven edges of FIG. 5), and when the sample of the input data signal has a low frequency, the COUNT result has a small value (two edges of FIG. 5).

The controller 340 generates the first control signal UP that increases (i.e., shifts the modulated clock signal to the right) the phase of the modulated clock signal and the second control signal DN that reduces (i.e., shifts the modulated clock signal to the left) the phase of the modulated clock signal based on the comparison result PD output from the phase comparator 320 and the COUNT result output from the edge counter 330.

Specifically, when the input data signal has a high frequency (e.g., the COUNT result is greater than a threshold), the controller 340 increases the amplitude of the first control signal UP and reduces that of the second control signal DN so as to shift the phase of the modulated clock signal to the right of the center of the data signal eye. When the input data signal has a low frequency (e.g., the COUNT result is lower than a threshold), the controller 340 reduces the amplitude of the first control signal UP and increases that of the second control signal DN so as to shift the phase of the modulated clock signal to the left of the center of the data signal eye.

Figure 6:
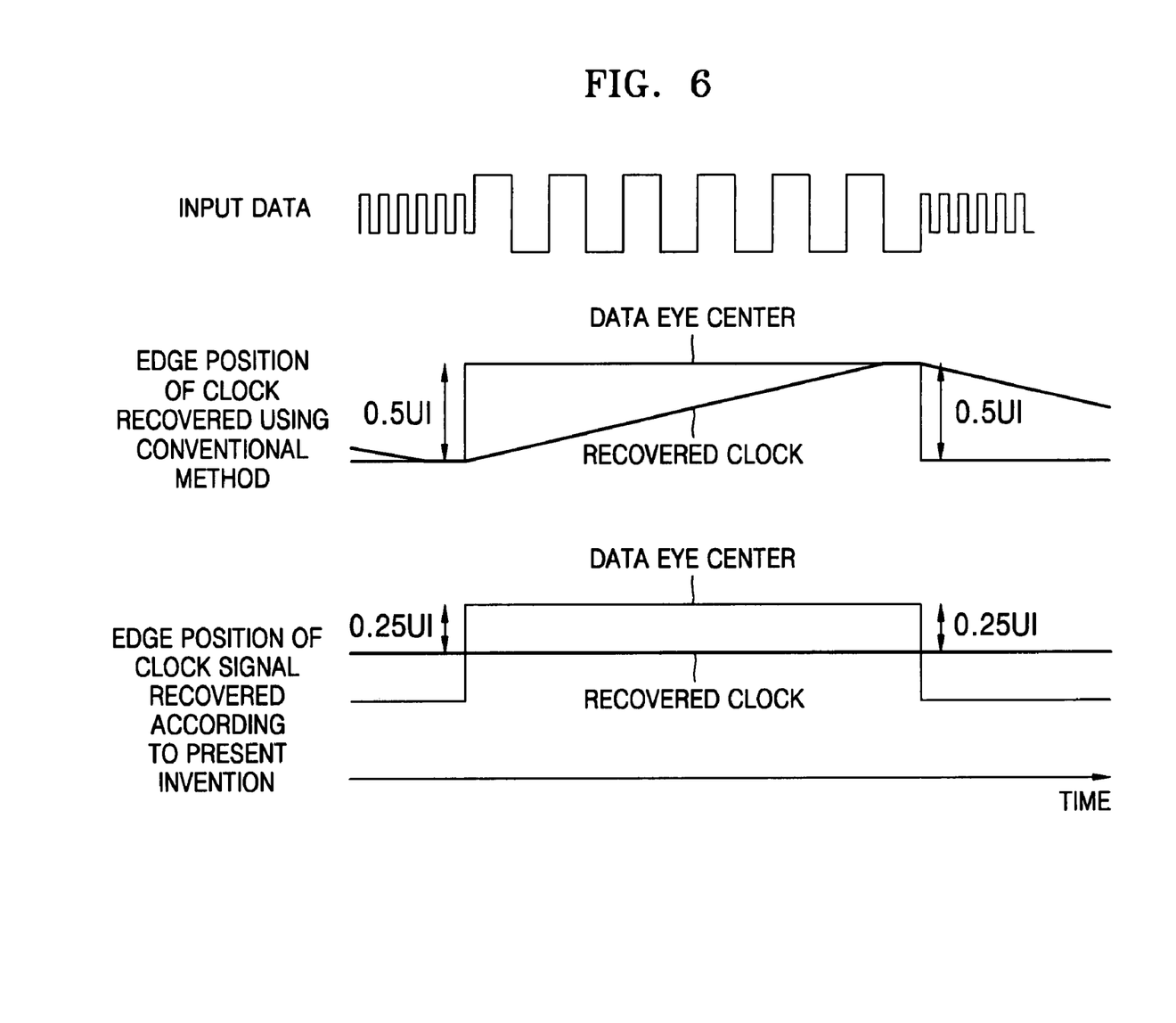
FIG. 6 illustrates the positions of an edge of a clock signal recovered using a conventional method and an edge of a clock signal recovered using a method according to some embodiments of the present invention.

FIG. 6 illustrates the positions of an edge of a clock signal recovered using a conventional method and an edge of a clock signal recovered using a method according to some embodiments of the present invention, in which the clock signal positions are adjusted according to a change in the frequency of an input data signal. Referring to FIG. 6, the edge of the clock signal recovered according to the conventional method is gradually moved toward the center of a data signal eye when the frequency of the input data signal changes from a high level to a low level or from a low level to a high level. Thus, after a predetermined time period elapses, the recovered clock signal has a timing margin of a maximum of about 0.5 unit intervals (UI). However, when the recovered clock signal does not have a timing margin at an instant of time when the frequency of the input data signal is changed, an error may occur in receiving data. Here, UI denotes a duration of the input data signal, and it is assumed that the difference between the edge of the high-frequency data signal and the edge of the low-frequency data signal, i.e., the difference between the centers of the eye of the high-frequency data signal and the eye of the low-frequency data signal, is a maximum of about 0.5 UI.

According to some embodiments of the present invention, when the input data signal has a high frequency, the phase of the modulated, recovered clock signal is shifted to the right of the center of the data signal eye by increasing the amplitude of the first control signal UP and reducing that of the second control signal DN as illustrated in FIG. 4, thereby preventing an edge of the modulated, recovered clock signal from being gradually moved toward the center of the data signal eye. Similarly, when the input data signal has a low frequency, the phase of the modulated, recovered clock signal is shifted to the left of the data signal eye by reducing the amplitude of the first control signal UP and increasing the amplitude of the second control signal DN as illustrated in FIG. 4, thereby preventing an edge of the modulated, recovered clock signal from being gradually moved toward the center of the data signal eye. According to some embodiments of the present invention, even when the frequency of the input data signal suddenly changes, the edge of the recovered clock signal is positioned about in the middle of the centers of the eye of the high-frequency data signal and the eye of the low-frequency data signal, thereby maintaining the timing margin of about 0.25 UI.

The de-serializer 370 transforms the sample data signal into a parallel data signal in response to the clock signal modulated by the clock phase modulator 360. In general, because the input serial data signal has a high frequency, a circuit that recovers a clock signal may increase the jitter tolerance level of the sample clock signal. Stable sample serial data obtained using the circuit is transformed into a parallel data signal by down-converting the frequency of the sample serial data using the de-serializer 370. A digital processing circuit described below processes the parallel data signal.

Referring to FIG. 3, the controller 340 includes a mixer 341, a loop filter 342, and a control signal generator 343. The mixer 341 receives the comparison PD result output from the phase comparator 320 and the COUNT result output from the edge counter 330. The mixer 341 output may be generated by combining the comparison PD result and the COUNT result, subtracting the COUNT result from the comparison PD result, or adding weights to the comparison PD result and the COUNT result and combining the weighted comparison PD result and the weighted COUNT result, in accordance with various embodiments of the present invention.

The loop filter 342 may average the output from the mixer 341 using a low pass filter (LPF) (not shown). The control signal generator 343 compares the average with a threshold and generates the first and second control signals UP and DN according to the comparison result. More specifically, when the average is greater than the threshold, the control signal generator 343 generates the first and second control signals UP and DN such that the amplitude of the first control signal UP is greater than that of the second control signal DN. When the average is less than the threshold, the control signal generator 343 generates the first and second control signals UP and DN such that the amplitude of the first control signal UP is less than that of the second control signal DN.

Figure 7:
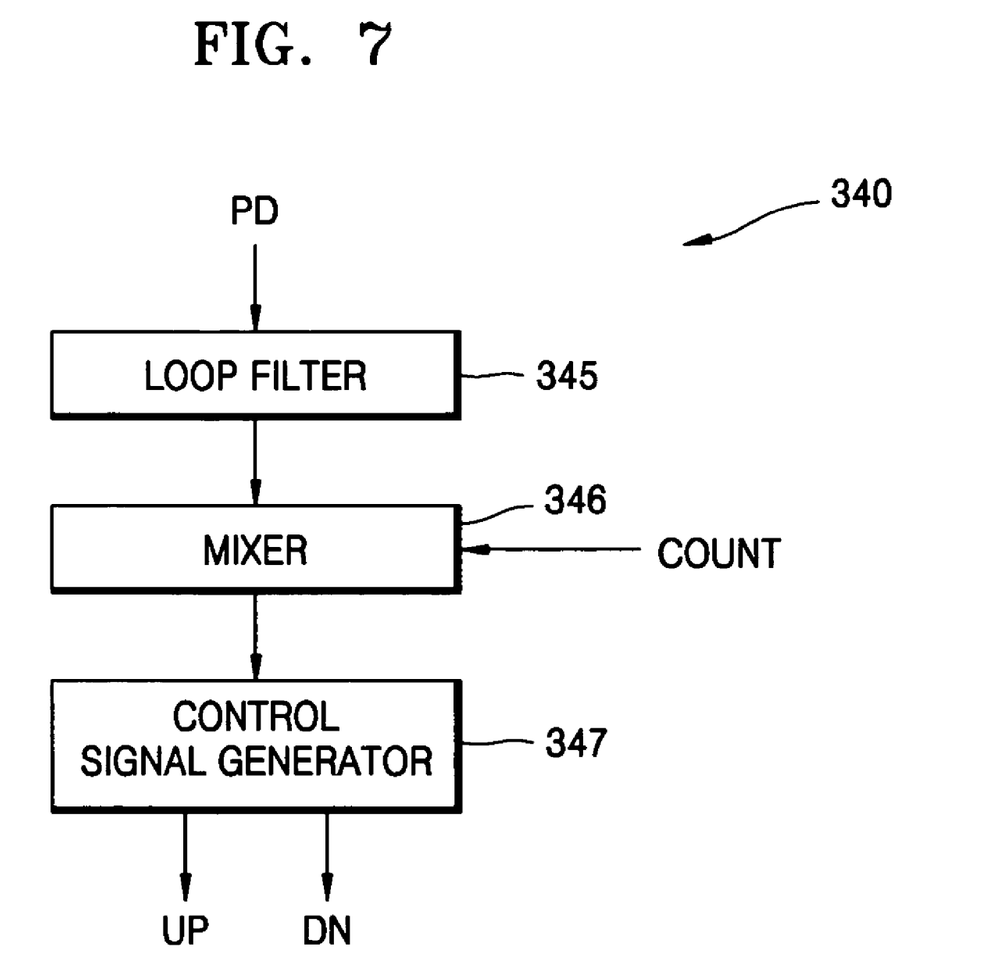
FIG. 7 is a block diagram of a control unit illustrated in FIG. 3 according to further embodiments of the present invention.

A controller 340 of FIG. 3, according to some embodiments of the present invention, is illustrated in FIG. 7 and may be used to generate the first and second control signals UP and DN. Referring to FIG. 7, the controller 340 includes a loop filter 345, a mixer 346, and a control signal generator 347.

The loop filter 345 obtains an average of the comparison PD result output from the phase comparator 320 using the LPF, and the mixer 346 combines the average output from the loop filter 345 and the COUNT result output from the edge counter 330.

The control signal generator 347 compares the output of the mixer 346 with a threshold, and generates the first and second control signals UP and DN based on the comparison. In some embodiments, when the output of the mixer 346 is greater than the threshold, the control signal generator 347 generates the first and second control signals UP and DN such that the amplitude of the first control signal UP is greater than that of the second control signal DN. When the output of the mixer 346 is less than the threshold, the control signal generator 347 generates the first and second control signals UP and DN such that the amplitude of the first control signal UP is less than that of the second control signal DN.

As described above, in the clock recovery system 300 according to some embodiments of the present invention, the phase detector 320 computes the position of an edge of an input data signal using a sample of the input data signal and compares the computed position of the edge of the input data signal and the position of an edge of a modulated clock signal. The edge counter 330 counts a number of transitions of the input data signal in the sample of the input data signal.

Therefore, the controller 340 generates the first control signal UP that increases the phase of the modulated clock signal (i.e., shifts the modulated clock signal to the right) and the second control signal DN that reduces the phase of the modulated clock signal (i.e., shifts the modulated clock signal to the left) based on the comparison PD result and the COUNT result. The clock phase modulator 360 generates the modulated clock signal by adjusting the phase of an input clock signal using the first and second control signals UP and DN. The sampler 310 generates the sample data signal by sampling the input data in synchronization with the modulated clock signal.

As described above, a clock recovery system according to some embodiments of the present invention adjusts the phase of a sample clock signal according to the frequency of transition edges of an input data signal. That is, the clock recovery system moves the phase of the sample clock signal to the right of the center of a data signal eye when an input data signal has a high frequency, and moves the phase of the sample clock signal to the left to the center of the data signal eye when the input data signal has a low frequency. Therefore, even when the frequency of the input data signal suddenly changes, it may be possible to receive the input data signal without an error in a stable manner, thereby improving the jitter tolerance level.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A clock recovery system, comprising:
   a sampler that is configured to sample an input data signal in synchronization with a modulated clock signal to generate a sample of the input data signal;
   a phase comparator that is configured to compute a position of a transition edge of the input data signal using the sample data signal, and to compare the computed position with a position of an edge of the modulated clock signal to generate a comparison result;
   an edge counter that is configured to count transition edges of the sample data signal;
   a controller that is configured to generate first and second control signals based on the comparison result and the count of the transition edges; and
   a clock phase modulator that is configured to generate the modulated clock signal by adjusting a phase of an input clock signal responsive to the first and second control signals, such that the phase is increased in response to the first control signal and reduced in response to the second control signal.

2. The clock recovery system of claim 1, wherein the input data signal is a serial data signal, and wherein the clock recovery system further comprises:
   a de-serializer that is configured to transform the sample data signal into a parallel data signal responsive to the modulated clock signal.

3. The clock recovery system of claim 1, further comprising:
   a phase-locked loop that is configured to multiply a frequency of a reference clock signal to generate the input clock signal.

4. The clock recovery system of claim 1, wherein the controller is further configured to generate the first and second control signals such that an amplitude of the first control signal is greater than an amplitude of the second control signal so as to move the phase of the modulated clock signal to the right of a center of an input data signal eye if the transition edge count indicates that the input data signal has a high frequency, and to generate the first and second control signals such that the amplitude of the second control signal is greater than the amplitude of the first control signal so as to move the phase of the modulated clock signal to the left of the center of the input data signal eye if the transition edge count indicates that the input data signal has a low frequency.

5. The clock recovery system of claim 4, wherein the controller comprises:
   a mixer that is configured to generate an output responsive to the comparison result and the transition edge count;
   a loop filter that is configured to generate an average of the mixer output; and
   a control signal generator that is configured to compare the average with a threshold to generate the first and second control signals.

6. The clock recovery system of claim 5, wherein the control signal generator is further configured to generate the first and second control signals, such that the amplitude of the first control signal is greater than the amplitude of the second control signal when the average is greater than the threshold and the amplitude of the first control signal is less than the amplitude of the second control signal when the average is less than the threshold.

7. The clock recovery system of claim 4, wherein the controller comprises:
   a loop filter that is configured to generate an average of the comparison result;
   a mixer that is configured to generate an output responsive to the average and the transition edge count; and
   a control signal generator that is configured to compare the mixer output with a threshold to generate the first and second control signals.

8. The clock recovery system of claim 7, wherein the control signal generator is further configured to generate the first and second control signals, such that the amplitude of the first control signal is greater than the amplitude of the second control signal when the mixer output is greater than the threshold and the amplitude of the first control signal is less than the amplitude of the second control signal when the mixer output is less than the threshold.

9. A clock recovery method, comprising:
  sampling an input data signal in synchronization with a modulated clock signal to generate a sample of the input data signal;
  computing a position of a transition edge of the input data signal using the sample data signal;
  comparing the computed position with a position of an edge of the modulated clock signal to generate a comparison result;
  counting transition edges of the sample data signal;
  generating first and second control signals based on the comparison result and the count of the transition edges; and
  generating the modulated clock signal by adjusting a phase of an input clock signal responsive to the first and second control signals, such that the phase is increased in response to the first control signal and reduced in response to the second control signal.

10. The clock recovery system of method 9, wherein the input data signal is a serial data signal, and wherein the method further comprises:
  transforming the sample data signal into a parallel data signal responsive to the modulated clock signal.

11. The clock recovery method of claim 9, further comprising:
  multiplying a frequency of a reference clock signal to generate the input clock signal.

12. The clock recovery method of claim 9, wherein generating the first and second control signals comprises:
  generating the first and second control signals such that an amplitude of the first control signal is greater than an amplitude of the second control signal so as to move the phase of the modulated clock signal to the right of a center of an input data signal eye if the transition edge count indicates that the input data has a high frequency; and
  generating the first and second control signals such that the amplitude of the second control signal is greater than the amplitude of the first control signal so as to move the phase of the modulated clock signal to the left of the center of the input data signal eye if the transition edge count indicates that the input data signal has a low frequency.

13. The clock recovery method of claim 12, wherein generating the first and second control signals comprises:
  generating an output responsive to the comparison result and the transition edge count;
  generating an average of the output; and
  comparing the average with a threshold to generate the first and second control signals.

14. The clock recovery method of claim 13, wherein generating the first and second control signals further comprises:
  generating the first and second control signals such that the amplitude of the first control signal is greater than the amplitude of the second control signal when the average is greater than the threshold and the amplitude of the first control signal is less than the amplitude of the second control signal when the average is less than the threshold.

15. The clock recovery method of claim 12, wherein generating the first and second control signals comprises:
  generating an average of the comparison result;
  generating an output responsive to the average and the transition edge count; and
  comparing the output with a threshold to generate the first and second control signals.

16. The clock recovery method of claim 15, wherein generating the first and second control signals further comprises:
  generating the first and second control signals such that the amplitude of the first control signal is greater than the amplitude of the second control signal when the mixer output is greater than the threshold and the amplitude of the first control signal is less than the amplitude of the second control signal when the output is less than the threshold.

* * * * *